United States Patent [19]
Pietsch et al.

[11] Patent Number: 6,051,498
[45] Date of Patent: Apr. 18, 2000

[54] METHOD FOR MANUFACTURING A SEMICONDUCTOR WAFER WHICH IS COATED ON ONE SIDE AND PROVIDED WITH A FINISH

[75] Inventors: Georg Pietsch, Burghausen; Bernd Sauter, Emmerting; Ernst Feuchtinger, Wittibreut, all of Germany

[73] Assignee: Wacker Siltronic Gesellschaft für Halbleitermaterialien AG, Burghausen, Germany

[21] Appl. No.: 09/003,490

[22] Filed: Jan. 6, 1998

[30] Foreign Application Priority Data

Feb. 6, 1997 [DE] Germany .................... 197 04 546

[51] Int. Cl.[7] .................................. H01L 21/302
[52] U.S. Cl. ................................ 438/691; 438/692
[58] Field of Search ...................... 438/690, 691, 438/692, 693; 156/345; 451/41, 190, 194

[56] References Cited

U.S. PATENT DOCUMENTS

| | | |
|---|---|---|
| 4,144,099 | 3/1979 | Edmonds et al. .................. 438/974 |
| 4,888,304 | 12/1989 | Nakagawa et al. ................. 438/406 |
| 4,983,251 | 1/1991 | Haisma et al. ......................... 438/3 |
| 5,360,509 | 11/1994 | Zakaluk et al. ..................... 438/691 |
| 5,364,655 | 11/1994 | Nakamura et al. ................. 427/129 |
| 5,389,579 | 2/1995 | Wells ................................. 438/690 |
| 5,643,405 | 7/1997 | Bello et al. ........................ 438/692 |
| 5,700,179 | 12/1997 | Hasegawa et al. ................... 451/41 |
| 5,759,088 | 6/1998 | Kondratenko ........................ 451/41 |

FOREIGN PATENT DOCUMENTS 0607940   7/1994   European Pat. Off. .

*Primary Examiner*—Benjamin L. Utech
*Assistant Examiner*—Duy-Vu Deo
*Attorney, Agent, or Firm*—Collard & Roe, P.C.

[57] ABSTRACT

A method for manufacturing a semiconductor wafer which is coated on one side and provided with a finish has a) the semiconductor wafer being subjected to a first treatment (double-sided finish) which produces a finish on both sides of the semiconductor wafer at the same time; has b) at least one coating being produced on one side of the semiconductor wafer; and has c) the semiconductor wafer being subjected to a second treatment which produces a double-sided finish.

8 Claims, No Drawings

METHOD FOR MANUFACTURING A SEMICONDUCTOR WAFER WHICH IS COATED ON ONE SIDE AND PROVIDED WITH A FINISH

BACKGROUND OF THE INVENTION

1. Field of the Invention

The present invention is directed to a method for manufacturing a semiconductor wafer which is coated on one side and provided with a finish.

2. The Prior Art

Treatment which produces a finish on a semiconductor wafer is understood as material-removing treatment by means of which the shaping of the semiconductor wafer is essentially concluded. This treatment has the objective of transforming the surface of the semiconductor wafer, in particular the two sides of the semiconductor wafer, into a particularly flat, smooth and defect-free state. Such a treatment is particularly necessary to give the semiconductor wafer the properties which are required for further processing to form highly integrated electronic components. The most important treatment methods which produce a finish on the sides of a semiconductor wafer comprise material-removing methods such as chemical/mechanical polishing and fine grinding. In both cases, processing tools are used which have rotating working surfaces and act on one or both sides of a semiconductor wafer, specific removal of material being produced. In the case of chemical/mechanical polishing, a polishing means and a polishing cloth, which is stretched over the working surface of the processing tool (polishing plate) bring about the removal of material. In the case of fine grinding, the working surface of the processing tool is fitted with disks which have a material-removing layer of bound, fine grinding powder. Since every semiconductor wafer has a front side and a rear side, a distinction is made between a single-side treatment and a double-sided treatment. This distinction is explained below with reference to the example of polishing.

In the case of single-side polishing (SSP), after the rear side of the semiconductor wafer has been mounted on a suitable carrier only the front side of the semiconductor wafer is polished with a polishing cloth which is stretched over a polishing plate. During the mounting, a positively and frictionally engaging connection is produced between the rear side and the carrier, for example by means of adhesion ("template polishing"), bonding, cementing or vacuum application. Single-side polishing methods and devices are customary for single-wafer treatment ("single-wafer polishing") or for the treatment of groups of wafers ("batch polishing"). In the case of double-sided polishing (DSP), the front side and rear side of the semiconductor wafer are polished simultaneously. DSP occurs by leading a plurality of semiconductor wafers between two upper and lower polishing plates which have polishing cloths stretched over them. In this case, the semiconductor wafers are used in thin carrying cages ("wafer carrier") which are referred to as rotor wafers and are also used in a similar form when lapping semiconductor wafers. Double-sided polishing methods and devices are always configured for the treatment of groups of semiconductor wafers ("batch polishing").

A semiconductor wafer which is polished on both sides has very many fewer disruptive particles in comparison with a semiconductor wafer which is polished on only one side. Also, it is easier to clean and is less susceptible to contamination, and finally it can be metrologically measured, characterized and specified more easily.

U.S. Pat. No. 5,389,579 describes a method which indicates how a semiconductor wafer which is polished on one side can be manufactured by double-sided polishing.

Basically, a semiconductor wafer which is polished on both sides can be manufactured by polishing the front side and rear side successively with a single-side polishing method (sequential SSP). However, double-sided polishing is the method predominantly used to achieve polishing of both sides of a semiconductor wafer. Advantages of DSP over sequential SSP lie in the superior degree of flatness and plane-parallelism of the sides which can be achieved. Other advantages include the possibility of carrying out the polishing more cost-effectively and the higher throughput rate and the higher yield due to the elimination of the mounting, removal and turning steps necessary with sequential SSP.

A differentiation which corresponds to the difference between SSP and DSP can also be made with respect to fine grinding. In this case, it is also appropriate that the result of a fine grinding which is performed on one side even if both sides of a semiconductor wafer are successively ground, is inferior to the result of a fine grinding performed on two sides. The term "double-sided treatment" is used below for treatments of a semiconductor wafer which remove material, and produce a double-sided finish. This term is also used for double-sided polishing or for double-sided fine grinding, and is suitable for providing a semiconductor wafer with particularly flat, plane-parallel, smooth and defect-free sides. Such double-sided treatments have in common the fact that the semiconductor wafer is moved between rotating working surfaces of a processing tool. This causes material to be removed from the sides of the semiconductor wafer with the assistance of this tool.

Any method of handling an already polished or finely-ground semiconductor wafer with a mechanically acting handling tool runs the risk of causing damage to the wafer. For example, a handler entails the risk of damage to the polished or finely-ground surface of the disk, for example as a result of the fact that marks or scratches are produced. Such damage which relates to the side of the semiconductor wafer on which the electronic components are to be accommodated is particularly critical. On the other hand, there is a series of applications in which one side of the semiconductor wafer has to be coated at least once. This procedure then inevitably entails the risk of mechanical damage to the opposite side.

EP-607,940 A2 describes a method in which firstly there is a protective layer produced on the rear side of a semiconductor wafer and then the opposite front side of the semiconductor wafer is polished. However, the chronological arrangement of a single-side coating before single-side polishing has disadvantages. For example, single-side polishing is inferior to double-sided polishing in terms of the flatness and plane-parallelism of the sides which can be achieved. It is particularly disadvantageous that the surface of the side which is provided for coating and whose flatness is still inadequate is buried and conserved by a coating which precedes the polishing. Subsequent single-side polishing cannot eliminate this deficiency.

SUMMARY OF THE INVENTION

It is an object of the present invention to provide semiconductor wafers whose properties are comparable, in terms of flatness, plane-parallelism, smoothness and freedom of the sides from defects despite the presence of a single-side coating, with properties of those semiconductor wafers which are provided with a double-sided finish and do not have such a coating.

The above object is achieved in accordance with the present invention which comprises a method for manufacturing a semiconductor wafer which is coated on one side and provided with a finish, and which comprises the steps of:

a) subjecting a semiconductor wafer to a first double-sided finish treatment which produces a double-sided finish on both sides of the semiconductor wafer at the same time;

b) producing at least one coating on one side of the semiconductor wafer; and c) subjecting the semiconductor wafer to a second double-sided finish treatment which produces a double-sided finish on both sides of the wafer simultaneously.

DETAILED DESCRIPTION OF PREFERRED EMBODIMENTS

The treatment which is carried out in step a) and produces a double-sided finish provides a semiconductor wafer with optimum wafer geometry. That is to say that the wafer is provided with particularly flat, plane-parallel, smooth and defect-free sides. The treatment which is carried out in step a) provides in particular a wafer geometry which is completely identical to the geometry achieved by means of step c). The single-side coating of the semiconductor wafer which is considered necessary for the respective application then takes place in step b). In step c), the semiconductor wafer is given a second double-sided finish. As a result, both damage on the uncoated side, which has possibly come about during the coating procedure, and unevenness on the coated side are eliminated. In this context, the advantageous wafer geometry which is achieved in step a) is completely retained without adversely affecting the uniformity of the layer which has been applied. The invention method can be carried out cost effectively because identical method steps are to be performed both before and after the coating in accordance with step b). Also identical processing tools are used to carry out these method steps.

A modification of the method, by replacing the steps a) and c) or one of these steps by means of single-side SSP treatments, for example a single-side polishing or a sequential single-side polishing, is, not recommended. For reasons of cost and due to the unfavorable results of single-side treatment, this SSP treatment is not recommended.

On the other hand, any type of double-sided treatment, in particular the double-sided polishing and the double-sided fine grinding is suitable for carrying out the steps a) and c). Furthermore, the steps a) and c) do not necessarily have to be carried out with the same treatment method. Thus, step a) can comprise, for example, double-sided polishing and step c) can comprise double-sided fine grinding. Alternatively, double-sided fine grinding in step a) can be followed by double-sided polishing in step c).

Coating according to method step b) of the invention comprises the production of one or more layers on one side of the semiconductor wafer. The coating can take place in accordance with any known procedure, in particular by depositing a layer or by producing a layer by means of chemical or physical transformation, such as thermal oxidation or doping. After the coating, the surfaces of the two sides of the semiconductor wafer can be distinguished by reference to different chemical or physical properties. Examples of single-side coatings are the deposition of epitaxial, polycrystalline or amorphous layers of the semiconductor material or of other materials on one side of the semiconductor wafer. Another example is the production of a thin oxide layer on one side of the semiconductor wafer by means of surface oxidation of the surface on this side with an oxidation agent. A plurality of coatings can also be made successively on one side of the semiconductor wafer, for example by depositing one on top of the other, or having two epitaxial layers with different dopings in each layer.

Steps a) and c) can be realized in such a way that in step a) the absolute value of the difference is $|A_v-A_r|<A_d/10$ and in step c) is $|A_v-A_r|\geq A_d/10$. Here, $|A_v-A_r|$ signifies the absolute value of the difference between the material removed from the front side and that removed from the rear side of the semiconductor wafer and $A_d$ signifies the arithmetic mean of the material removed from the front and rear sides. If the absolute value of the difference is greater than or equal to a tenth of the average amount of material removed, then the treatment of the sides can be considered to be asymmetrical. Asymmetrical means that markedly different amounts of material are removed from the front side and the rear side of the semiconductor wafer. An asymmetrical removal of material can come about, for example, due to chemical or structural differences between the two sides in themselves. That is to say that the asymmetry occurs without technical processing methods.

An asymmetrical removal of material can also be brought about intentionally. This can occur, for example, by using a processing tool whose working surfaces rotate at different speeds and/or are provided with polishing cloths or disks which remove material to different degrees. Such measures can also be reversed in order to compensate for chemical or structural differences of the two sides. Such measures will achieve a similar removal of material on both sides of the semiconductor wafer. If the specified difference is smaller than a tenth of the average amount of material removed, the amounts of material removed are similar or identical and the treatment of the sides can be considered to be symmetrical. The advantage of an asymmetrical treatment of the sides is provided in step c) in particular if a coating with a very thin layer has been selected in step b) or if, for other reasons, it is possible to remove only a small amount of material from the layer produced.

The three stage method of the invention is suitable in particular for treating semiconductor wafers made of silicon. These silicon wafers have been separated from a crystal and possibly preground or lapped and have preferably also passed through a treatment with an etching agent. However, the method is not basically restricted to the manufacture of semiconductor wafers which are coated on one side. Other fields of application relate to the manufacture of workpieces which are coated on one side and are made of glass, ceramics, metal or plastics, for example the manufacture of coated optical disks or electronic storage media.

A preferred application of the method according to the invention relates to the manufacture of bonded semiconductor wafers by means of hydrophilic direct wafer bonding. Here, pairs of silicon wafers which are coated on one side with an oxide layer are connected on the oxide side. The result is that a sandwich structure is produced with an oxide layer buried between two monocrystalline silicon layers. In the case of direct bonding, it is of the utmost significance that the oxide layers of the pair of wafers can be applied one to the other in a positively engaging fashion. The method according to the invention can provide semiconductor wafers which completely meet this requirement.

While several embodiments of the present invention have been described, it is to be understood that many changes and modifications may be made thereunto without departing from the spirit and scope of the invention as defined in the appended claims.

What is claimed is:

1. A method for manufacturing a semiconductor wafer which is coated on one side and provided with a finish, consisting essentially of the steps of:
   a) subjecting a semiconductor wafer to a first double-sided finish treatment which produces a double-sided finish on both sides of the semiconductor wafer simultaneously;
   b) producing at least one coating on one side of the semiconductor wafer; and
   c) subjecting the semiconductor wafer to a second double-sided finish treatment which produces a double-sided finish on both sides of the wafer simultaneously.

2. The method as claimed in claim 1, wherein the double-sided treatment of the semiconductor wafer in accordance with step a) and step c) is selected from the group of treatments consisting of a double-sided polishing and a double-sided fine grinding.

3. The method as claimed in claim 2, wherein the double-sided treatment of the semiconductor wafer in accordance with step a) and step c) is a double-sided polishing.

4. The method as claimed in claim 2, wherein the double-sided treatment of the semiconductor wafer in accordance with step a) and step c) is a double-sided fine grinding.

5. The method as claimed in claim 1, wherein the coating in accordance with step b) is selected from the group consisting of depositing of a layer on one side of the semiconductor wafer, and producing a layer by means of chemical or physical transformation of the surface of one side of the semiconductor wafer.

6. The method as claimed in claim 5, wherein the coating in accordance with step b) is a depositing of a layer on one side of the semiconductor wafer.

7. The method as claimed in claim 5, wherein the coating in accordance with step b) is producing a layer by means of chemical or physical transformation of the surface of one side of the semiconductor wafer.

8. The method as claimed in claim 1, comprising
   subjecting the semiconductor wafer in step a) to symmetrical double-sided polishing; and
   subjecting the semiconductor wafer in step c) to asymmetrical double-sided polishing.

* * * * *